(12) United States Patent
Huang et al.

(10) Patent No.: US 8,571,080 B2
(45) Date of Patent: Oct. 29, 2013

(54) HIGH EFFICIENCY SLAB-COUPLED OPTICAL WAVEGUIDE LASER AND AMPLIFIER

(75) Inventors: Robin K. Huang, N. Billerica, MA (US); Reuel P. Swint, Billerica, MA (US); Joseph P. Donnelly, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/629,572

(22) Filed: Dec. 2, 2009

(65) Prior Publication Data
US 2011/0128982 A1 Jun. 2, 2011

(51) Int. Cl.
*H01S 5/22* (2006.01)
(52) U.S. Cl.
USPC ............... 372/45.01; 372/43.01; 372/46.01
(58) Field of Classification Search
USPC ......................................................... 372/45.01
See application file for complete search history.

(56) References Cited

U.S. PATENT DOCUMENTS

| | | | |
|---|---|---|---|
| 4,689,797 A | 8/1987 | Olshansky | |
| 4,799,228 A | 1/1989 | Nagasaka et al. | |
| 4,860,297 A * | 8/1989 | Hayakawa et al. | 372/45.01 |
| 4,942,585 A | 7/1990 | Ungar | |
| 5,003,548 A * | 3/1991 | Bour et al. | 372/44.01 |
| 5,022,036 A * | 6/1991 | Suyama et al. | 372/45.01 |
| 5,189,680 A * | 2/1993 | Kimura | 372/46.014 |
| 5,197,077 A | 3/1993 | Harding et al. | |
| 5,272,711 A | 12/1993 | Mawst et al. | |
| 5,369,658 A | 11/1994 | Ikawa et al. | |
| 5,376,582 A | 12/1994 | Behdar-Rad et al. | |
| 5,504,768 A * | 4/1996 | Park et al. | 438/39 |
| 5,594,749 A | 1/1997 | Behdar-Rad et al. | |
| 5,805,627 A * | 9/1998 | Kubota et al. | 372/45.01 |
| 5,805,755 A | 9/1998 | Amersfoort et al. | |
| 6,256,330 B1 | 7/2001 | LaComb | |
| 6,432,735 B1 | 8/2002 | Cho et al. | |
| 6,650,671 B1 * | 11/2003 | Garbuzov et al. | 372/45.01 |
| 7,027,475 B1 | 4/2006 | Zediker et al. | |
| 2001/0009558 A1 * | 7/2001 | Shigihara | 372/45 |

(Continued)

FOREIGN PATENT DOCUMENTS

JP 58115878 7/1983
JP 59218786 12/1984

(Continued)

OTHER PUBLICATIONS

Connolly et al., NASA Contractor Report, 4238,"High-Power Single Spatial mode AlGaAs Channeled-Substrate-Planar Semiconductor Diode Lasers for Spaceborne Communications", 1989.

(Continued)

*Primary Examiner* — Xinning Niu
(74) *Attorney, Agent, or Firm* — Gesmer Updegrove LLP

(57) ABSTRACT

A slab-coupled optical waveguide laser (SCOWL) is provided that includes an upper and lower waveguide region for guiding a laser mode. The upper waveguide region is positioned in the interior regions of the SCOWL. The lower waveguide region also guides the laser mode. The lower waveguide region is positioned in an area underneath the upper waveguide region. An active region is positioned between the upper waveguide region and the lower waveguide region. The active region is arranged so etching into the SCOWL is permitted to define one or more ridge structures leaving the active region unetched.

18 Claims, 6 Drawing Sheets

(56) References Cited

U.S. PATENT DOCUMENTS

| | | | |
|---|---|---|---|
| 2001/0033591 A1 | 10/2001 | Fukunaga et al. | |
| 2002/0024984 A1* | 2/2002 | Ohkubo et al. | 372/46 |
| 2002/0061044 A1* | 5/2002 | Kuniyasu et al. | 372/48 |
| 2003/0017662 A1 | 1/2003 | Cho et al. | |
| 2004/0208213 A1 | 10/2004 | Lichtenstein et al. | |
| 2005/0163172 A1 | 7/2005 | Sacher et al. | |
| 2006/0193353 A1 | 8/2006 | Kim et al. | |
| 2009/0116525 A1 | 5/2009 | Shchukin et al. | |

FOREIGN PATENT DOCUMENTS

| | | |
|---|---|---|
| JP | 6085374 A | 3/1994 |
| JP | 2000323792 A | 11/2000 |
| WO | 2008114896 | 9/2008 |

OTHER PUBLICATIONS

Wenzel et al., "Fundamental-Lateral Mode Stabilized High-Power Ridge-Waveguide Lasers with a Low Beam Divergence" IEEE Photonics Technology Letters, vol. 20, No. 3, Feb. 1, 2008.

Botez et al., "Terraced-heterostructure large-optical-cavity AlGaAs diode laser" A new type of high-power cw single-mode device 1982 American Institute of Physics.

Butler et al., "Spatial mode discrimination and control in high-power single-mode constricted double-heterojunction large-optical-cavity diode lasers" Appl. Physics Letters, Dec. 15, 1982.

Butler et al., "Lateral Mode Discrimination and Control in High-Power Single-Mode Diode Lasers a~of the Large-Optical-Cavity (LOC) Type" 1984, IEEE Journal of Quantum Electronics, vol. QE-20, No. 8.

Crump et al., "Multiple vertical mode high power 975nm diode lasers restricted to single vertical mode operation through use of optical facet coatings" Electronics Letters, Jan. 1, 2009, vol. 45, No. 1.

Popovichev et al., "High-power single-transverse-mode ridge optical waveguide semiconductor lasers" Quantum Electronics, 2002.

Jones et al., "Near-diffraction-limited power (~1W) single longitudinal mode CW diode laser tunable from 960 to 980 nm" Electronics Letters Sep. 14, 1995, vol. 31, No. 19.

Maiorov et al., "High Power InGaAsP/InP Broad-Waveguide Single-Mode Ridge-Waveguide Lasers" 2000 Optical Society of America.

Osowski et al., "High-power, single-mode, eye-safe wavelength semiconductor lasers" 2008 SPIE, vol. 7114.

Al-Muhanna et al., "14.3 W quasicontinuous wave front-facet power from broad-waveguide Al-free 970nm diode lasers" 1997 American Institute of Physics.

Hi-Tech Report, Sharp Develops Single-Transverse-Mode High-Power Laser Diode, JEE, Nov. 1990.

Chan et al., "Designs for High Power, Single Mode Operation in Broad Stripe Semiconductor Lasers" SPIE vol. 893, High Power Lasers Diodes and Applications, 1988.

Bettiati et al., "High Brightness Single-Mode 1060-nm Diode Lasers for Demanding Industrial Applications" Lasers and Electro-Optics, 2007 and the International Quantum Electronics Conference, published Jun. 2007.

Mawst, "High-Power, Single-Mode Antiresonant Reflecting Optical Waveguide-type Diode Lasers" Conference: Laser Diodes and Applications, Feb. 1995.

Mawst, "High-power narrow-beam single-mode ARROW-type semiconductor diode lasers" 1996 SPIE The International Society for Optical Engineering, Jan. 1996.

Dutta et al., "Single-mode high-power lasers emitting at 980nm" Feb. 1995.

Chida, "High-power Single-transverse-mode Operation of Narrow-ridge-waveguide 0.98-um InGaAs/AlGaAs strained-quantum-well Lasers by in situ Monitored RIBE" International Laser conference 1994.

International Search Report and Written Opinion issued on Jul. 22, 2011 in relation to International Application No. PCT/US2010/056662.

* cited by examiner

HIGH EFFICIENCY SLAB-COUPLED OPTICAL WAVEGUIDE LASER AND AMPLIFIER

GOVERNMENT INTEREST STATEMENT

This invention was made with government support under Contract No. FA8721-05-C-0002 awarded by the U.S. Air Force. The government has certain rights in this invention.

BACKGROUND OF THE INVENTION

The invention is related to the field of slab-coupled optical waveguide lasers (SCOWL), and in particular to a high efficiency SCOWL where the active region of the SCOWL is placed within the interior regions of the SCOWL waveguide, instead of at the edges.

The development of high power, reliable and efficient semiconductor lasers emitting in a single spatial mode has been a challenge for the past few decades.

Earlier demonstrated SCOWL structures required etching through the quantum-well (QW) active region. Etching through the active region eliminates the possibility of lateral current spreading. Current spreading usually causes the laser mode in the SCOWL device to change dramatically as the current spreading becomes more severe under high current injection levels. The problem with etching through the active region, particularly in the AlGaAs/InGaAs/GaAs materials system, is that etching often introduces surface defects at the exposed QW sidewall location. These surface defects propagate into the QW as the device is operated, and the defects can limit the device reliability and operating time since they lead to non-radiative recombination centers.

SUMMARY OF THE INVENTION

According to one aspect of the invention, there is provided a slab-coupled optical waveguide laser (SCOWL). The SCOWL includes an upper waveguide region for guiding a laser mode. The upper waveguide region is positioned in the interior regions of the SCOWL. The lower waveguide region also guides the laser mode. The lower waveguide region is positioned in an area underneath the upper waveguide region. An active region is positioned between the upper waveguide region and the lower waveguide region. The active region is arranged so etching into the SCOWL is permitted to define one or more ridge structures leaving the active region unetched.

According to another aspect of the invention, there is provided a method for forming a slab-coupled optical waveguide laser (SCOWL). The method includes forming an upper waveguide region for guiding a laser mode. The upper waveguide region is positioned in the interior regions of the SCOWL. Also, the method includes forming a lower waveguide region for guiding the laser mode. The lower waveguide region is positioned in an area underneath the upper waveguide region. Moreover, the method includes positioning an active region between the upper waveguide region and the lower waveguide region. Furthermore, the method includes arranging the active region so etching into the SCOWL is permitted to define one or more ridge structures leaving the active region unetched.

DETAILED DESCRIPTION OF THE INVENTION

The invention provides an improved SCOWL design, where the active region of the SCOWL is placed within the interior regions of the SCOWL waveguide, instead of at the edges. This allows for etching into the SCOWL waveguide that is required for defining a ridge waveguide, and is also essential for defining the slab section of the inventive SCOWL device which provides the mode filtering resulting in the single-spatial mode operation. The required etch depth for the SCOWL operation in this improved design is selected such that the active region is unetched. The distance that the active region is located from the final etch depth is critical because it defines the amount of lateral current spreading that occurs.

Figure 1:
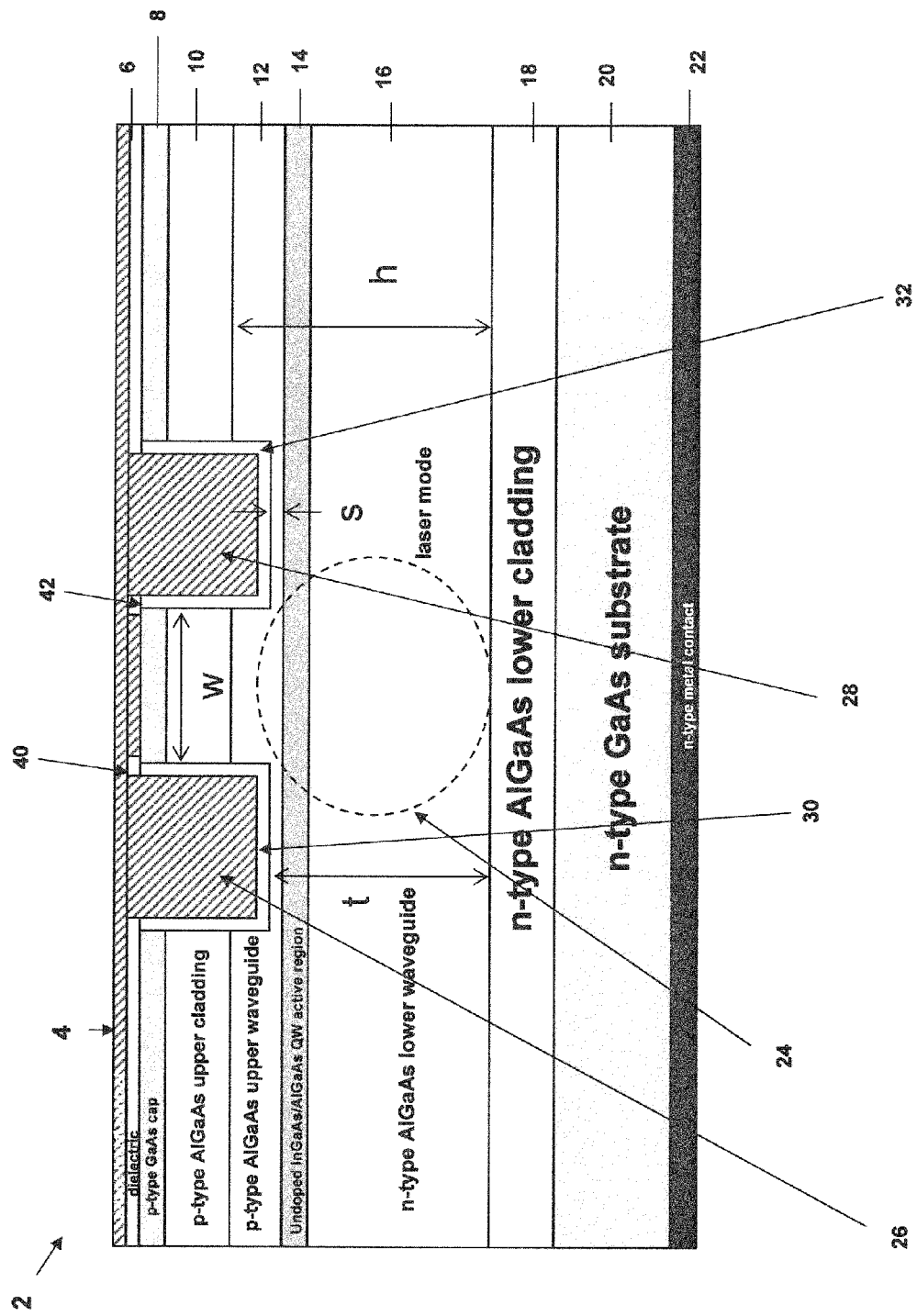
FIG. 1 is a schematic diagram illustrating a slab-coupled optical waveguide laser (SCOWL) formed in accordance of the invention.

FIG. 1 shows a cross-section view of a SCOWL 2 formed in accordance of the invention. The SCOWL 2 includes a p-type metal layer 4 positioned on a dielectric layer being 6. The dielectric layer 6 is positioned on a p-type GaAs cap layer 8. The SCOWL 2 also includes a p-type upper cladding layer 10 where the p-type GaAs cap layer 8 is positioned on. The p-type upper cladding layer 10 is formed on a p-type AlGaAs upper waveguide region 12. An undoped active region 14 is positioned between the p-type upper waveguide region 12 and an n-type lower waveguide region 16. The n-type lower waveguide region 16 is positioned on an n-type lower cladding layer 18. The n-type lower cladding layer is positioned on an n-type GaAs substrate 20, where the GaAs substrate 20 is positioned on an n-type metal layer 22. A number of trench structures are formed in regions that include the dielectric layer 6, p-type GaAs cap layer 8, p-type upper cladding layer 10, and p-type upper waveguide region 12. In addition, the trench structures 26, 28 are lined with a dielectric layers 30, 32. The content within the trench structures 26, 28 include the same materials that define the p-type metal layer 4 to form ridge waveguide structures. Alternatively, the trench structures 26, 28 can be filled with primarily with air and a metal lining. The dielectric layers 30, 32 include the same materials that define the dielectric layer 6.

The p-type upper cladding layer 10 and n-type lower cladding layer 16 assists in confinement of a laser mode 24 propagating through the p-type AlGaAs upper waveguide region 12, active region 14, and n-type lower waveguide region 16. The p-type upper waveguide region can include AlGaAs having a concentration of Al between 0% and 50% and a thickness between 0.10 μm and 1.0 μm with a doping level between $1\times10^{15}$ and $1\times10^{18}$ cm$^{-3}$. The n-type lower waveguide region 16 can include AlGaAs having a concentration of Al between 0% and 50% and a thickness between 1.0 μm and 8.0 μm with a doping level $1\times10^{15}$ and $1\times10^{18}$ cm$^{-3}$. The composition of the p-type upper cladding layer 10 and the n-type lower cladding layer 18 must be higher in Al percentage as compared to the p-type upper waveguide region 12 and the n-type lower waveguide region 16, respectively.

The active region 14 can include undoped quantum wells, barrier layers, and bounding layers. The active region having 14 undoped bounding sublayers can include AlGaAs, where the Al concentration is between 0% and 30%, or GaAsP, where the P concentration is between 0% and 30%, with a thickness between 1 and 20 nm. An active region 14 having undoped barrier layers can include GaAsP, where the P concentration is between 0% and 30%, or AlGaAs, where the Al concentration is between 0% and 30% Al, with a thickness between 1 and 20 nm. Moreover, an active region 14 having undoped quantum wells can include InGaAs, where the In concentration is between 0% and 40%, with a thickness between 1 and 20 nm Because the active region 14 is positioned between the waveguides 12, 16, it is necessary to dope the upper waveguide region 12 p-type, while the lower waveguide region 16 (where the largest fraction of the mode 24 is positioned) is doped n-type. By positioning the p-n junction around the active region 14, proper injection of electrons and holes into the active region 14 is ensured. By using this arrangement, the active region 14 is confined within the interior regions of the waveguide of the SCOWL 2. This permits etching in the SCOWL 2 to form the ridge waveguides leaving the active region unetched. This allows a finite amount of lateral current spreading to occur.

In conventional ridge waveguide lasers, the active region is typically placed near the center of the waveguide. In contrast, in the improved SCOWL device 2, the active region 14 is placed asymmetrically within the waveguide of the SCOWL 2, such that the upper waveguide region 12 thickness is less than the lower waveguide region 16 thickness. The active region 14 placement allows for obtaining a low optical confinement factor, which is essential for the SCOWL concept.

With respect to the active region 14 being quantum wells (QWs), it is necessary to reduce the number of QWs as compared with the earlier SCOWL structure when moving the active region inside of the SCOWL waveguide. This is because locating the QW within the SCOWL waveguide causes the optical intensity to be relatively higher than that of a similar design in which the QW is located at the edge of the SCOWL waveguide. One way to keep the optical confinement factor relatively constant is to reduce the number of quantum wells in the active region 14. In this embodiment, one can use two QWs in the improved SCOWL 2 instead of three QWs, which were used in the earlier SCOWL design.

Also, it is important that specific lengths s, w, h within the SCOWL 2 be obtained so optimal performance can be adhered to. The length w, which defines the distance between the trench structures 26, 28, can be between 1 μm and 7 μm. The length s, which defines the critical distance between the final etch depth of the ridge waveguides and the active region 14, can be between 0 and 0.3 μm. The length h, which defines the combined height of the upper waveguide region 12, active region 14, and lower waveguide region 16, can be between 1.3 μm and 9 μm.

Figure 2A:
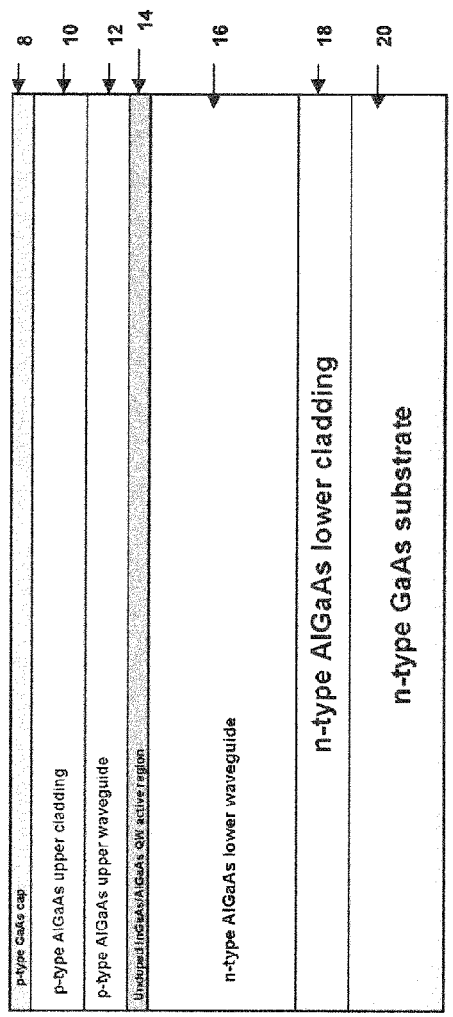
FIGS. 2A-2F are schematic diagrams illustrating the process flow for the fabrication of the SCOWL of FIG. 1.
Figure 2B:
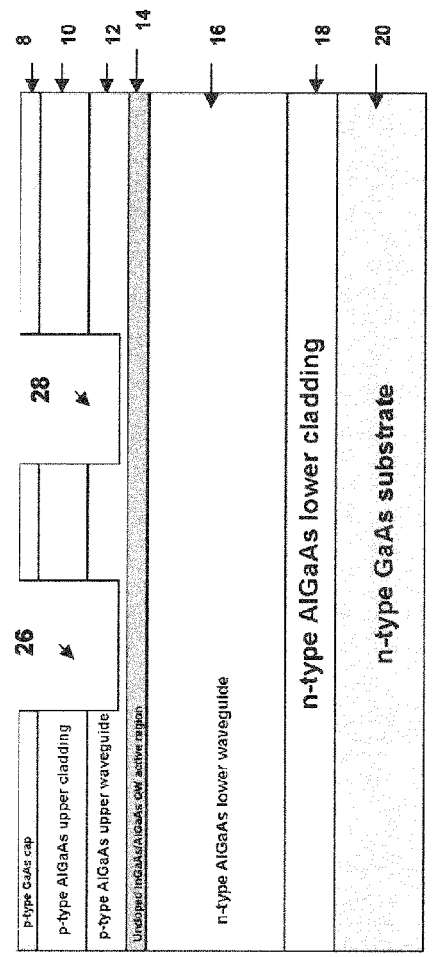
Figure 2C:
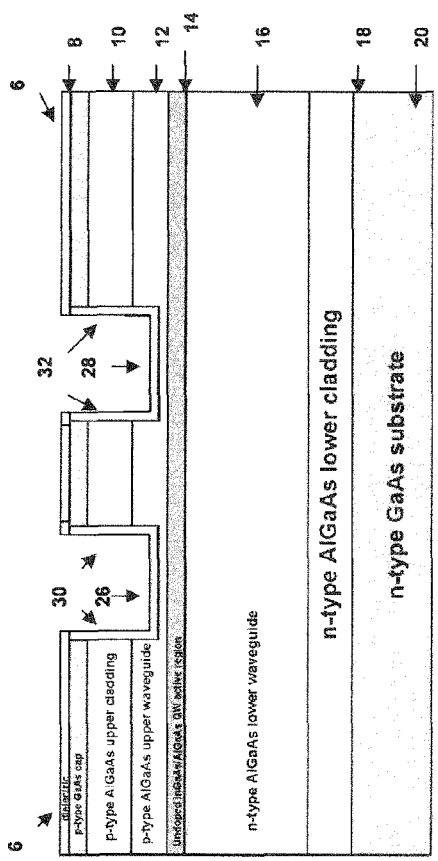
Figure 2D:
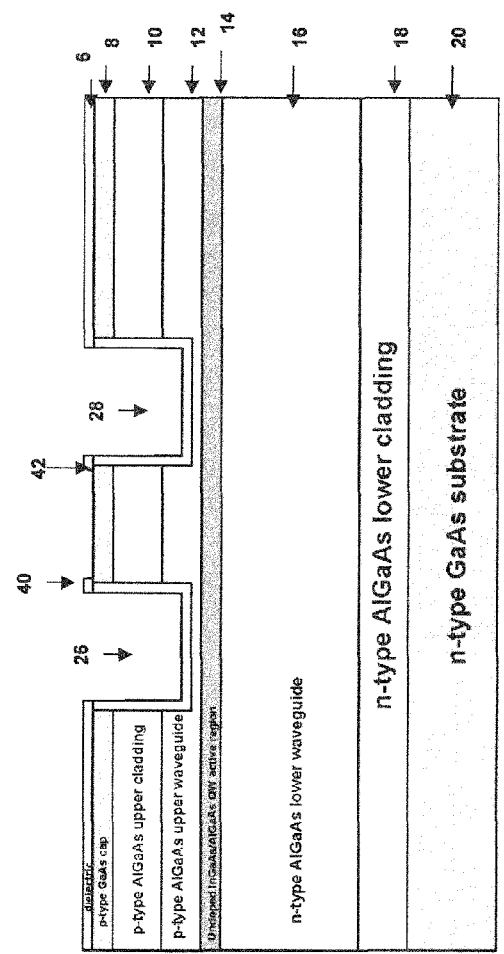
Figure 2E:
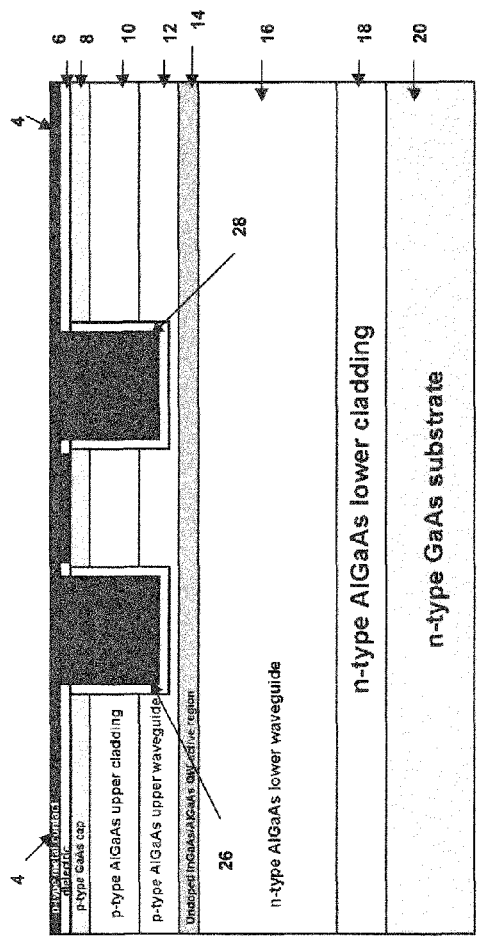
Figure 2F:
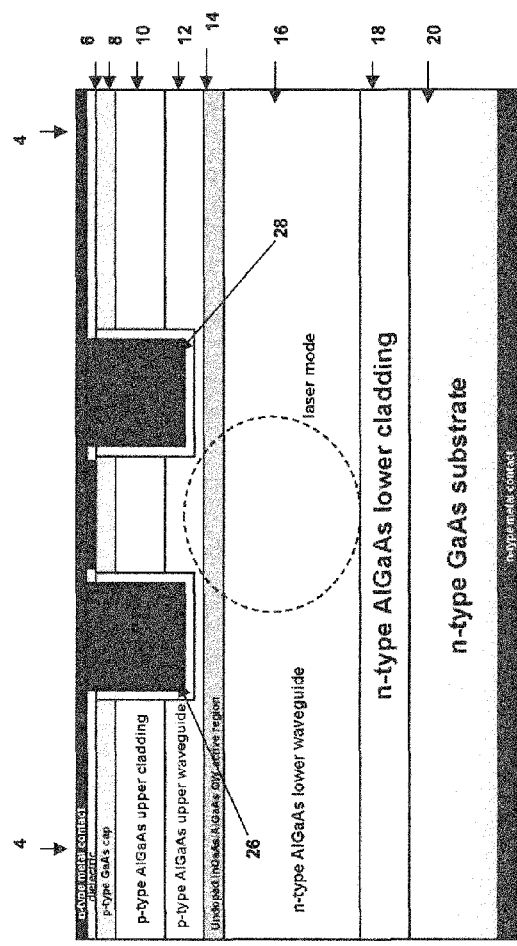

FIGS. 2A-2F illustrate a process flow in the fabrication of the inventive SCOWL 2 as shown in FIG. 1. FIG. 2A illustrates the material layers 8-20 being fabricated using standard crystal growth techniques such as MOCVD, OMVPE, and MBE. The material layers 8-20 are the same layers described in FIG. 1 with the exception to the dielectric layer 6, p-type metal layer 4, and n-type metal layer 22 which are fabricated later. FIG. 2B shows the formation of the trench structures 26, 28, where a mask was used to form the shape of the trench structure 26, 28 and wet chemical or dry etching, such as ICP etching, was used to etch portions of the layers 8-12 to form the trench structure 26, 28. FIG. 2C shows the deposition of dielectric material on the p-type GaAs cap layer 8 and within the trench structures 26, 28 to form layers 6, 30, and 32. The dielectric material can be any kind of reasonable dielectric, including $SiO_2$, $Al_2O_3$, etc. The dielectric deposition method can be pyrolytic, PECVD, ICP-assisted, etc. FIG. 2D shows the formation of contact openings 40, 42 on the ridge defined by the trench structures 26, 28. FIG. 2E shows the deposition of p-type metal materials on the top surface of the dielectric layer 6 to form the p-type metal layer 4 and the interior region of the trench structures 26, 28 to define ridge waveguides. FIG. 2F shows the backside deposition of an n-type metal on the n-type GaAs substrate 20 to form the n-type metal layer 22.

Figure 3:
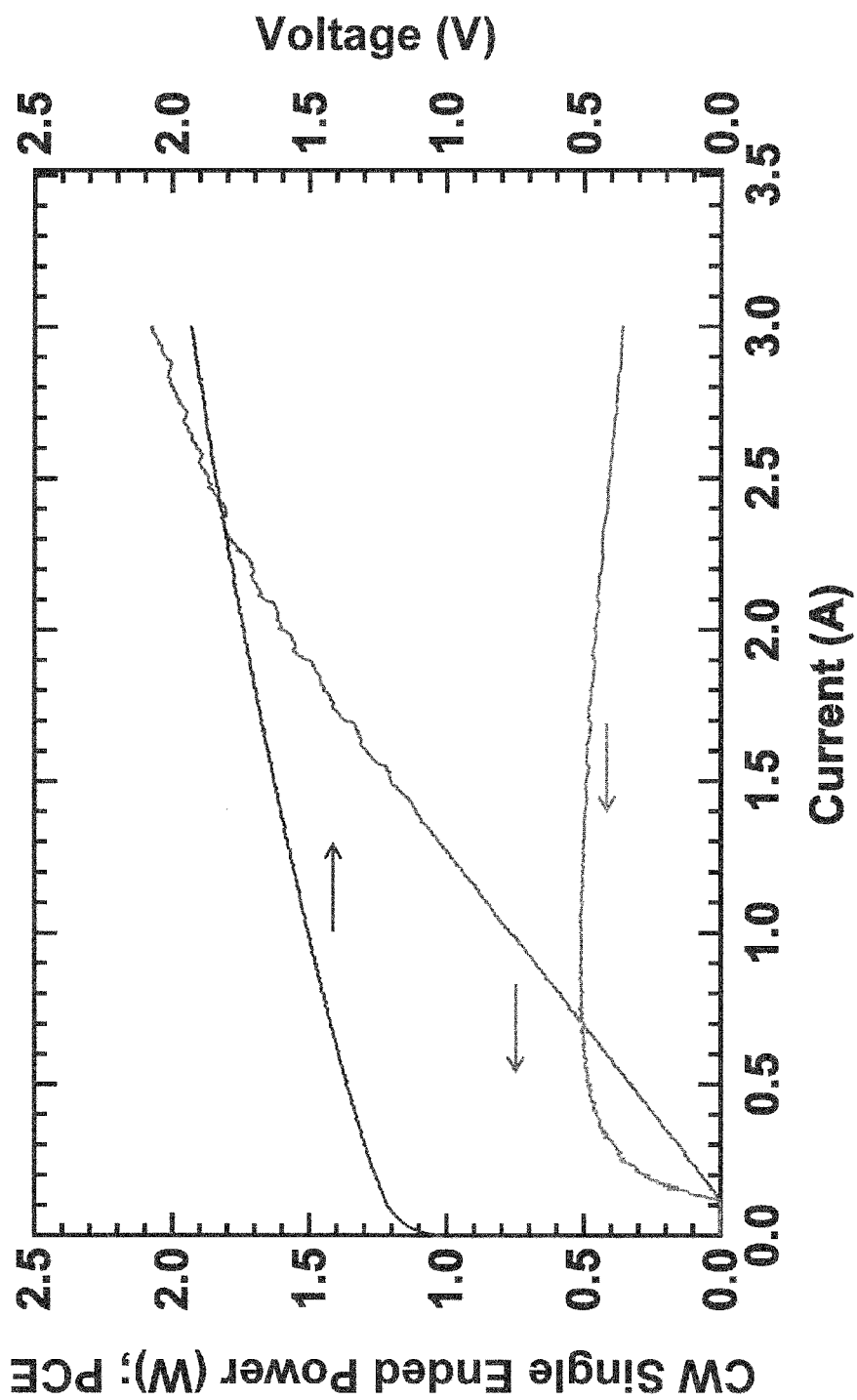
FIG. 3 is a graph illustrating measured power versus current, voltage versus current, and power conversion efficiency (PCE) versus current of a 1050 nm SCOWL formed in accordance with the invention.

FIG. 3 is a graph illustrating measured power versus current, voltage versus current, and power conversion efficiency (PCE) versus current of a 1050 nm SCOWL formed in accordance with the invention. Note the inventive SCOWL has kink-free operation up to P>1 W, maximum PCE>50%, and maximum power >2 W. This shows a substantial increase in operational performance over known SCOWLs in the prior art.

Figure 4A:
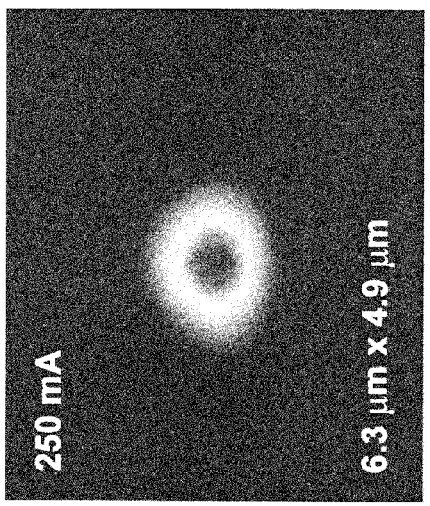
FIG. 4A-4C are near field beam profiles for a 1050 nm SCOWL formed in accordance with the invention.
Figure 4B:
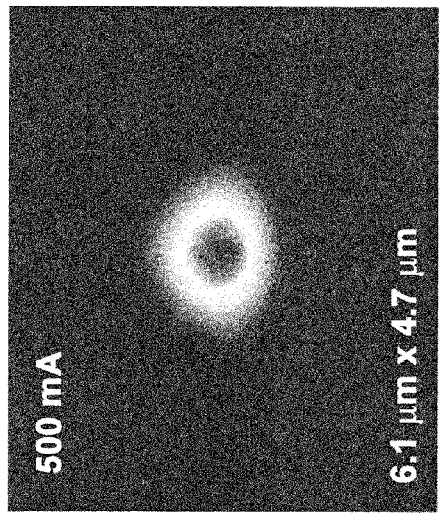
Figure 4C:
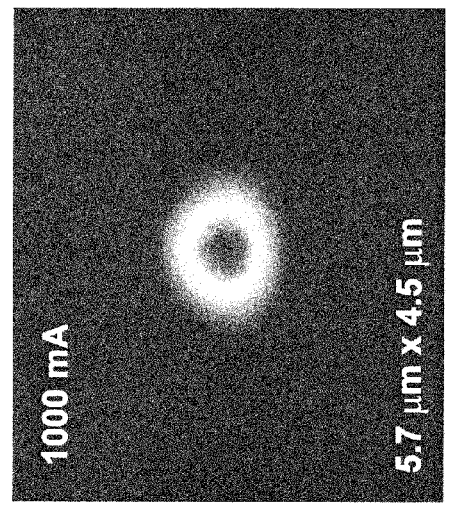

FIG. 4A-4C are near field beam profiles for a 1050 nm SCOWL formed in accordance with the invention. The inventive 1050 nm SCOWL demonstrates large nearly circular modes over a large range of operation current levels (250 mA, 500 mA, and 1000 mA). This illustrates substantial improvement in mode confinement as compared to other SCOWLs in the prior art.

This invention is a substantial improvement over previous SCOWL devices and also many other types of single-mode semiconductor lasers. Electrical-to-optical efficiency of 53% (CW) and 59% (pulsed) for junction-side up mounted SCOWL devices formed in accordance with the invention have been obtained. This is a substantial improvement over the earlier SCOWL devices, which had electrical-to-optical efficiency of 35%. The invention compares very favorably with conventional ridge waveguide lasers, which have efficiencies between 30 to 50% at this wavelength range. In addition, because the ridge width of the inventive SCOWL can be relatively wide, the inventive SCOWL has better performance at 1 W level output powers. The efficiency does not decline as rapidly at high current injection levels due to series resistance. For example, the peak CW electrical-to-optical efficiency of a ridge waveguide (RWG) laser is as high as 50%, but this rapidly drops off to 30% at power levels close to 1 W. The inventive SCOWL still has efficiencies of >40% at 1 W power levels. This makes a substantial difference in the thermal performance of these devices, particularly in array applications.

The high efficiency SCOWL described so far is implemented in the InGaAs/AlGaAs/GaAs material system. It is possible to design and implement the high efficiency SCOWL in other material systems and other wavelengths that are commonly used for semiconductor lasers and amplifiers, including, but not limited to, InGaAsP/GaAs, InGaAsP/InP, InGaAsSb/AJGaAsSb/GaSb, and InGaN/AlGaN/GaN.

The inventive SCOWL, when used in arrays, is useful for pumping high power ytterbium-doped fiber lasers. With wavelength beam combining (e.g., in an external cavity), dense SCOWL arrays can in principle enable collimated, high brightness beams with scalable output power, useful for a variety of applications. The amplifier version of this device could be used in high power phase-locked arrays in a seeded-injection amplifier approach.

Any of the above-discussed embodiments of high efficiency SCOWL devices and arrays may be incorporated into an associated laser system. Such a laser system may include, for example, the high efficiency SCOWL devices, the beam combining cavity, electrical, thermal, mechanical, electro-optical and opto-mechanical laser control equipment, associated software and/or firmware, and an optical power delivery subsystem. Embodiments of the high efficiency SCOWL and associated laser systems, can be used in applications that benefit from the high power and brightness of the embodied laser source produced using the high efficiency SCOWL devices. These applications may include, for example, materials processing, such as welding, drilling, cutting, annealing and brazing; marking; laser pumping; medical applications; and directed energy applications. In many of these applications, the laser source formed by the high efficiency SCOWL devices may be incorporated into a machine tool and/or robot to facilitate performance of the laser application.

Although the present invention has been shown and described with respect to several preferred embodiments thereof, various changes, omissions and additions to the form and detail thereof, may be made therein, without departing from the spirit and scope of the invention.

What is claimed is:

1. A slab-coupled optical waveguide laser (SCOWL) comprising:
   an upper waveguide region for guiding a laser mode, said upper waveguide region being positioned in the interior regions of the SCOWL, said upper waveguide region has a thickness greater than or equal to 0.5 µm;
   a lower waveguide region for guiding said laser mode, said lower waveguide region being positioned in an area underneath said upper waveguide region, said lower waveguide has a thickness greater than or equal to 3 µm, where the combined thickness of the upper waveguide region and lower waveguide region is greater or equal to 4 µm; and
   a quantum well active region positioned between said upper waveguide region and said lower waveguide region, said quantum well active region is positioned asymmetrically within said SCOWL such that said upper waveguide region thickness is less than said lower waveguide region thickness, said quantum well active region is arranged so etching into the SCOWL is permitted to define a ridge quantum well structure within a region of said upper waveguide region, said ridge structure lined with dielectric layers, having said quantum well active region unetched, said ridge quantum well structure permits a circular mode to exist over a defined set of current levels, an etched depth is selected permitting the quantum well active region to be unetched, the distance between the quantum well active region and the etched depth defining the amount of lateral current spreading that occurs so as to improve optical confinement factor, wherein the largest fraction of said circular mode is positioned in said lower waveguide region.

2. The SCOWL of claim 1 further comprising an upper cladding layer positioned near the upper waveguide region for confining said laser mode.

3. The SCOWL of claim 1 further comprising a lower cladding layer positioned near said lower waveguide region for confining said laser mode.

4. The SCOWL of claim 1, wherein said upper waveguide region comprises a p-type AlGaAs layer having a concentration of Al between 0% and 50%.

5. The SCOWL of claim 1, wherein said lower waveguide region comprises an n-type AlGaAs layer having a concentration of Al between 0% and 50%.

6. The SCOWL of claim 1, wherein said upper waveguide region comprises a thickness between 0.10 µm to 1.0 µm.

7. The SCOWL of claim 1, wherein said lower waveguide region comprises a thickness between 1.0 µm to 8.0 µm.

8. The SCOWL of claim 1, wherein said upper waveguide region comprises a p-type dopant concentration between $1 \times 10^{15}$ and $1 \times 10^{18}$ cm$^{-3}$.

9. The SCOWL of claim 1, wherein said lower waveguide region comprises an n-type dopant concentration between $1 \times 10^{15}$ and $1 \times 10^{18}$ cm$^{-3}$.

10. A method for forming a slab-coupled optical waveguide laser (SCOWL) comprising:
    forming an upper waveguide region for guiding a laser mode, said upper waveguide region being positioned in the interior regions of the SCOWL, said upper waveguide region has a thickness greater than or equal to 0.5 µm;
    forming a lower waveguide region for guiding said laser mode, said lower waveguide region being positioned in an area underneath said upper waveguide region, said lower waveguide has a thickness greater than or equal to 3 µm, where the combined thickness of the upper waveguide region and lower waveguide region is greater or equal to 4 µm;
    asymmetrically positioning a quantum well active region between said upper waveguide region and said lower waveguide region such that said upper waveguide region thickness is less than said lower waveguide region thickness; and
    arranging said quantum well active region so etching into the SCOWL is permitted to define a ridge structure within a region of said upper waveguide region, said ridge quantum well structure is lined with dielectric layers, having said quantum well active region unetched, said ridge quantum well structure permits a circular mode to exist over a defined set of current levels, an etched depth is selected permitting the quantum well active region to be unetched, the distance between the quantum well active region and the etched depth defining the amount of lateral current spreading that occurs so as to improve optical confinement factor, wherein the largest fraction of said circular mode is positioned in said lower waveguide region.

11. The method of claim 10 further comprising an upper cladding layer positioned near the upper waveguide region for confining said laser mode.

12. The method of claim 10 further comprising a lower cladding layer positioned near said lower waveguide region for confining said laser mode.

13. The method of claim 10, wherein said upper waveguide region comprises a p-type AlGaAs layer having a concentration of Al between 0% and 50%.

14. The method of claim 10, wherein said lower waveguide region comprises an n-type AlGaAs layer having a concentration of Al between 0% and 50%.

15. The method of claim 10, wherein said upper waveguide region comprises a thickness between 0.10 µm to 1.0 µm.

16. The method of claim 10, wherein said lower waveguide region comprises a thickness between 1.0 µm to 8.0 µm.

17. The method of claim 10, wherein said upper waveguide region comprises a p-type dopant concentration between $1 \times 10^{15}$ and $1 \times 10^{18}$ cm$^{-3}$.

18. The method of claim 10, wherein said lower waveguide region comprises an n-type dopant concentration between $1 \times 10^{15}$ and $1 \times 10^{18}$ cm$^{-3}$.

* * * * *